United States Patent
Hsieh

(10) Patent No.: US 7,020,448 B2
(45) Date of Patent: Mar. 28, 2006

(54) METHOD FOR DETECTING A TONE SIGNAL THROUGH DIGITAL SIGNAL PROCESSING

(75) Inventor: Chau-Kai Hsieh, Hsin-Chu Hsien (TW)

(73) Assignee: Conwise Technology Corporation Ltd., Hsin-Chu (TW)

( * ) Notice: Subject to any disclaimer, the term of this patent is extended or adjusted under 35 U.S.C. 154(b) by 473 days.

(21) Appl. No.: 10/248,994

(22) Filed: Mar. 7, 2003

(65) Prior Publication Data

US 2004/0176062 A1    Sep. 9, 2004

(51) Int. Cl.
*H04B 1/16* (2006.01)

(52) U.S. Cl. .................. 455/213; 455/221; 375/350

(58) Field of Classification Search ................ 455/218, 455/221, 267, 233.1, 212, 213; 375/219, 375/220, 346, 350

See application file for complete search history.

(56) References Cited

U.S. PATENT DOCUMENTS

| | | | | |
|---|---|---|---|---|
| 4,535,473 A | * | 8/1985 | Sakata | 704/248 |
| 5,046,126 A | * | 9/1991 | Ingram | 455/701 |
| 5,181,226 A | * | 1/1993 | Cantwell | 375/130 |
| 5,652,843 A | * | 7/1997 | Kane et al. | 704/208 |
| 5,862,212 A | * | 1/1999 | Mathews | 379/386 |
| 6,226,598 B1 | * | 5/2001 | De Vanssay et al. | 702/48 |
| 6,404,821 B1 | * | 6/2002 | Dent | 375/267 |
| 6,549,587 B1 | * | 4/2003 | Li | 375/326 |
| 2002/0161775 A1 | * | 10/2002 | Lasensky et al. | 707/100 |
| 2003/0081667 A1 | * | 5/2003 | Camnitz et al. | 375/226 |

\* cited by examiner

*Primary Examiner*—Nguyen T. Vo
*Assistant Examiner*—Nhan T. Le
(74) *Attorney, Agent, or Firm*—Winston Hsu

(57) ABSTRACT

A method for detecting a tone signal having a predetermined tone frequency includes receiving an analog communication signal, using a sampling frequency to convert the analog communication signal into a digital communication signal, selecting a plurality of signal sectors corresponding to a predetermined frequency range of the digital communication signal where the predetermined tone frequency agrees with the predetermined frequency range, and using the number of samples of each signal sector to determine whether the analog communication signal contains the tone signal.

15 Claims, 5 Drawing Sheets

METHOD FOR DETECTING A TONE SIGNAL THROUGH DIGITAL SIGNAL PROCESSING

BACKGROUND OF INVENTION

1. Field of the Invention

The present invention provides a method for detecting a tone signal corresponding to a tone frequency, and more specifically, to a method applying digital signal processing and a zero-crossing rate operation for detecting a tone signal.

2. Description of the Prior Art

A continuous tone-coded squelch system (CTCSS) has been broadly applied in the radio communication industry for communication between users through the same channel in a communication area. A CTCSS applies a low frequency tone signal (CTCSS tone) to distinguish a signal transmitted on a channel. A prior art walkie-talkie applies a CTCSS for group communication.

Please refer to FIG. 1. Illustrated in FIG. 1 is a graph of frequency range of a prior art CTCSS. A frequency range between 62.5 Hz and 250 Hz is applied for transmitting a low frequency tone signal, and a frequency range between 300 Hz and 3.4 KHz is applied for transmitting a speech signal generated by a user. In a prior art walkie-talkie, 14 physical channels, labeled from $P_1$ to $P_{14}$, are defined for transmitting and receiving signals. Each physical channel can be divided into 38 logical channels, labeled from $T_1$ to $T_{38}$, according to 38 different frequency tone signals so that 532 (14*38) logical channels are available. In a practical operation, a person wishing to communicate sets up a logical channel of a walkie-talkie, and pushes a push-to-talk (PTT) button for outputting his speech signal to a predetermined communication area. A walkie-talkie of a receiver in the predetermined communication area first determines whether or not the transmitted signal is on the same physical channel. If the physical channel is the same, the receiver's walkie-talkie starts to receive the speech signal and determines whether or not the transmitted speech signal has the same tone signal. If the physical channel is not the same, the walkie-talkie does not receive the speech signal. If the tone signal is the same, meaning that the logical channels of the two walkie-talkies are the same, the received speech signal is output through a speaker; if not, the walkie-talkie performs a squelch function and does not output the received speech signal. Only people in the predetermined communication area having walkie-talkies on the same logical channel can communicate as a group.

How to detect a logical channel is an important issue in a prior art walkie-talkie. Please refer to FIGS. 1 and 2. Illustrated in FIG. 2 is a functional block diagram of a prior art walkie-talkie. A portable walkie-talkie 10 comprises an antenna 11, a transceiver 12, a selector 14, a CTCSS decoder 16, a CTCSS encoder 18, a speech signal processing unit 20, a speaker 22, a microphone 24, and a control unit 26. A high frequency RF signal is received and transmitted through the antenna 11 of the walkie-talkie 10, converted to a low frequency Rx signal by the transceiver 12, transmitted to the selector 14, and output from point A of the selector 14 to the CTCSS decoder 16. The CTCSS decoder 16 comprises an analog signal frequency filtering circuit having an operational frequency range between 62.5 Hz and 250 Hz. The CTCSS decoder 16 identifies the frequency of a tone signal of the Rx signal, determines whether or not the tone signal of the Rx signal belongs to the same logical channel, and then outputs an analytical result to the control unit 26. If the corresponding logical channel of the Rx signal is the same as that of the walkie-talkie 10, the control unit 26 turns on the speech signal processing unit 20 causing the speaker 22 to output a speech signal. The speech signal processing unit 20 comprises two analog signal frequency filtering circuits having an operational frequency range from 300 Hz to 3.4 KHz. In contrast, if the corresponding logical channel of the Rx is different than that of the portable walkie-talkie, the control unit 26 does not turn on the speech signal processing unit 20 and the speaker 22 so that no speech signals are output. When a user pushes a PTT button, the selector 14 selects the point B, and the control unit 26 turns on the microphone 24 so that a speech signal of the user is transmitted through the speech signal processing unit 20 to the encoder 18. The encoder 18 then adds a corresponding tone signal to the output signal from the speech signal processing unit 20 according to the logical channel of the portable walkie-talkie 10, and generates a Tx signal that is converted to a high frequency RF signal and output through the antenna 11.

The prior art walkie-talkie 10 applies analog signal processing to tone signals for processes ranging from receiving an analog RF signal to outputting an analog Rx signal. A CTCSS decoder 16 must use a prior art frequency filtering circuit for collecting signals from the 62.5 Hz to 250 Hz frequency range. However, the prior art frequency filtering circuit cannot concisely collect signals from such a frequency range due to inherent limitations. As 38 tone signals are positioned from 62.5 Hz to 250 Hz, a frequency difference between neighboring tone signals is only about 3 Hz to 5 Hz. Thus a CTCSS decoder 16 may fail to properly distinguish a tone signal.

SUMMARY OF INVENTION

It is therefore a primary objective of the claimed invention to provide a radio communication device applying digital signal processing and zero crossing rate operations for detecting a tone signal corresponding to a tone frequency to overcome the problems of the prior art.

The claimed invention provides a method for detecting a tone signal corresponding to a tone frequency with a radio communication device. The method comprises, receiving an analog communication signal, converting the analog communication signal to a digital speech signal with a sampling frequency wherein the digital speech signal is made up of a plurality of signal sectors each of which corresponds to one period, selecting a plurality of signal sectors corresponding to a predetermined frequency range from the digital speech signal in a frame time, and determining whether or not the analog communication signal comprises the tone signal corresponding to the tone frequency according to a number of samples in each signal sector wherein the tone frequency is in the predetermined frequency range.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 2:
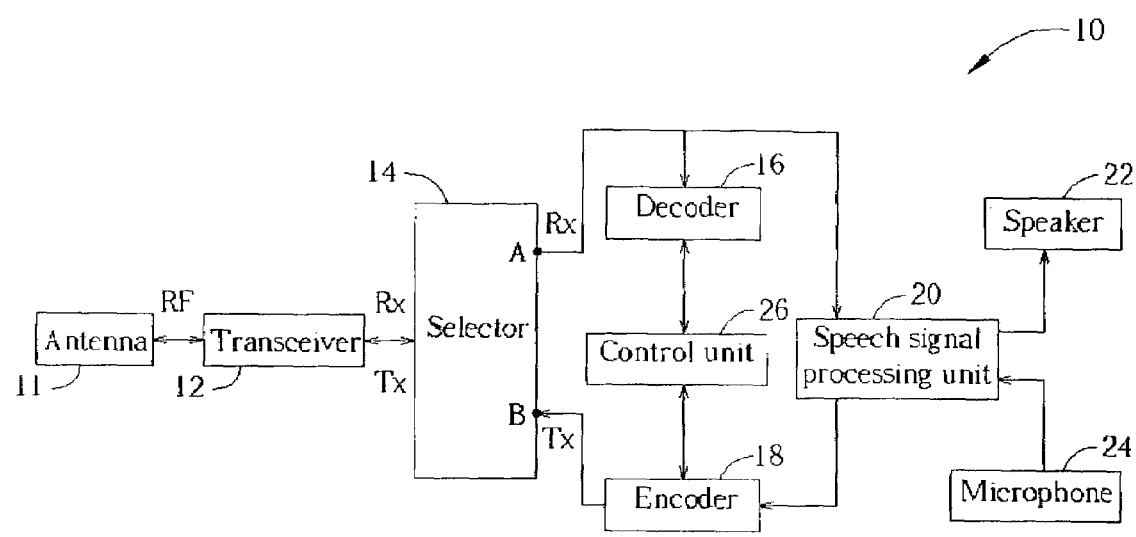
FIG. 2 is a functional block diagram of a prior art walkie-talkie.
Figure 3:
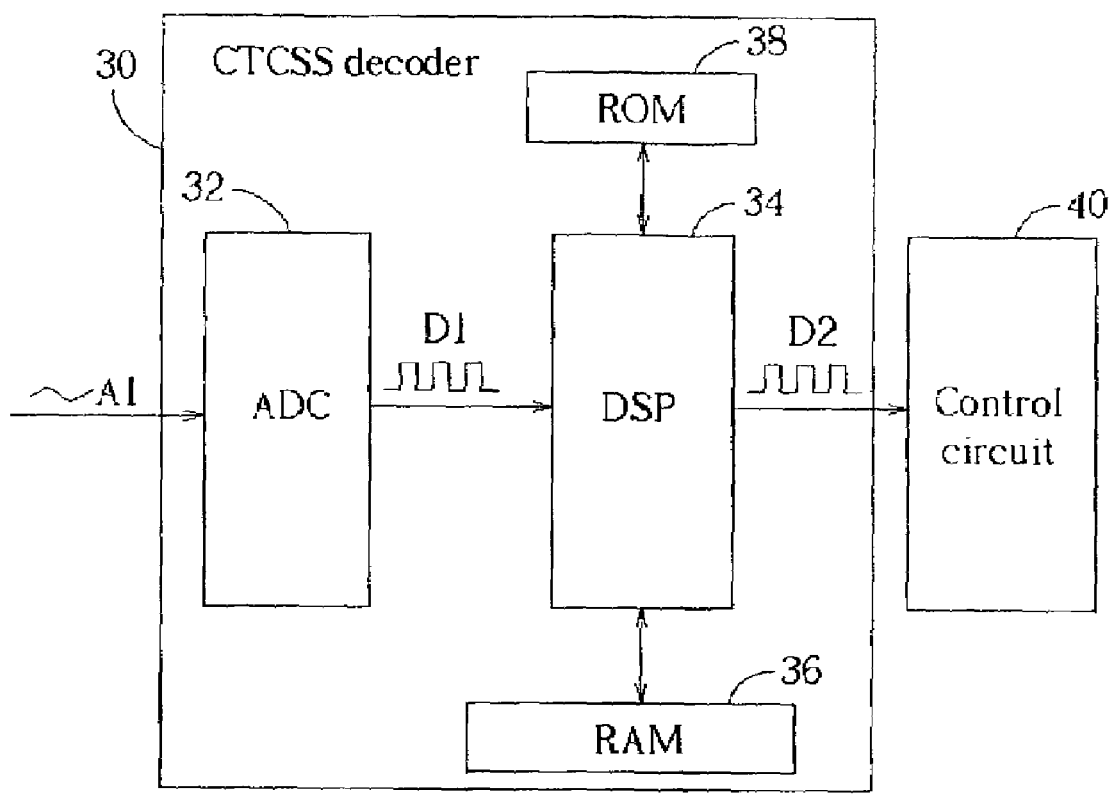
FIG. 3 is a functional block diagram of the present invention CTCSS.

Please refer to FIG. 3. Illustrated in FIG. 3 is a functional block diagram of a present invention CTCSS decoder 30. The CTCSS decoder 30 is applied in the prior art walkie-talkie 10 illustrated in FIG. 2 for detecting a tone signal and logical channel corresponding to a received communication signal. In the present embodiment, the CTCSS decoder 30 comprises an analog-to-digital converter (ADC) 32, a digital signal processor (DSP) 34, a random access memory (RAM) 36, and a read-only memory (ROM) 38. As illustrated in FIG. 2, where a speech signal A1 is received at the antenna 11 and transmitted to the CTCSS decoder 30, the ADC 32 of the present invention converts the received analog speech signal A1 to a digital signal D1 referencing a sampling frequency. The digital signal D1 is then transmitted to the DSP 34 for determining whether or not the logical channel of the digital signal D1 is the same to the logical channel of the walkie-talkie 10. Accordingly the DSP 34 analyses the digital signal D1 from 62.5 Hz to 250 Hz to determine the tone frequency of the speech signal A1. The ROM 38 stores application programs of the DSP 34, and the RAM 36 acts as a buffer used to temporarily store cache data generated during program operation of the DSP 34. After the digital signal D1 is operated on by the DSP 34, an analytical result D2 is generated and transmitted to a control circuit 40 (such as a microprocessor) used to control the overall operation of the walkie-talkie 10 and to provide a man machine interface (MMI). According to the analytical result D2, the control circuit 40 determines whether or not to output signals between 300 Hz to 3.4 KHz of the speech signal A1 through an output apparatus, such as the speaker 22 illustrated in FIG. 2.

Figure 4:
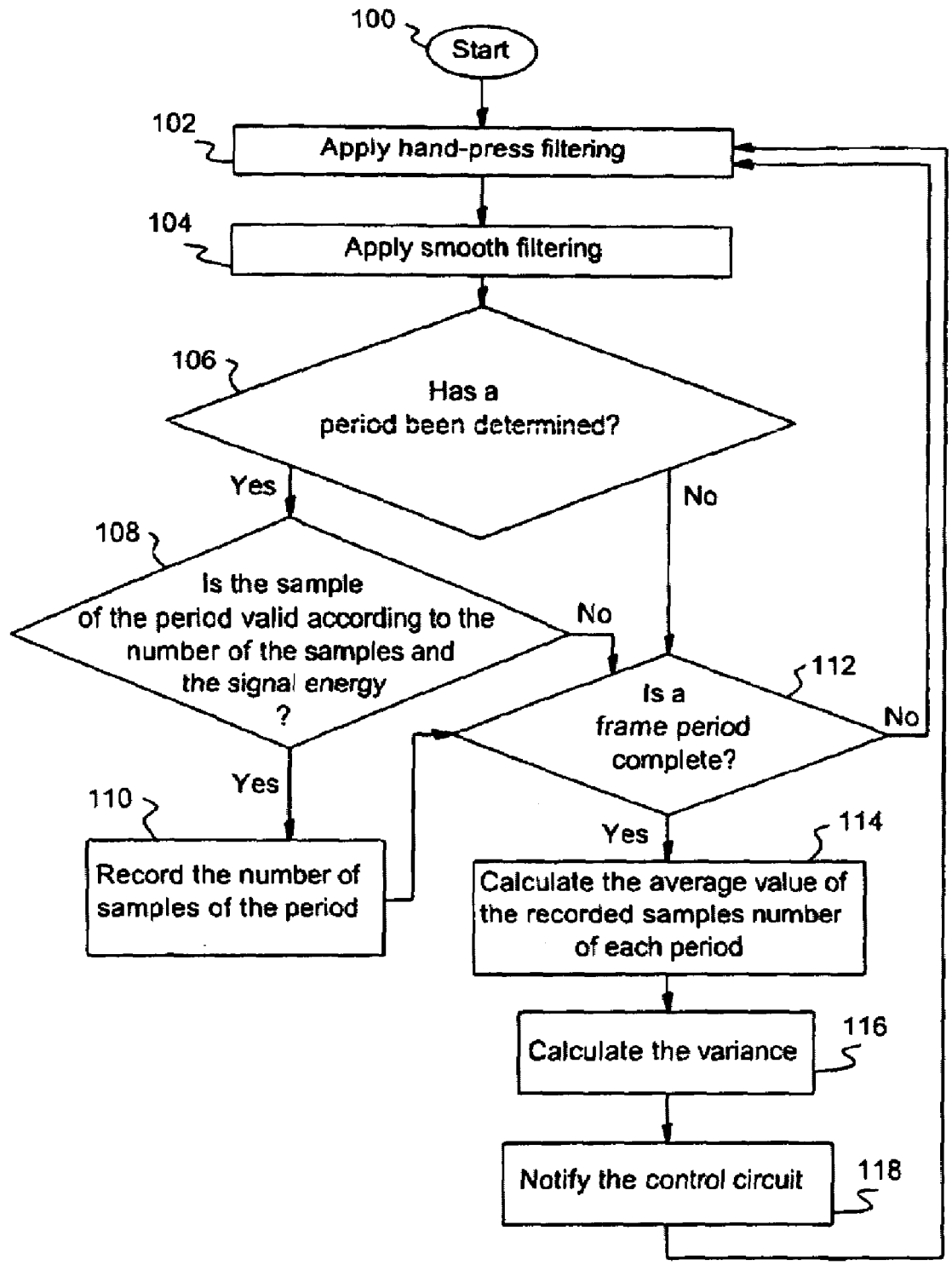
FIG. 4 is an operational flowchart of the digital signal processor shown in FIG. 3.

Please refer to FIG. 4. FIG. 4 is the flowchart of an operation of the digital signal processor 34 shown in FIG. 3. The flowchart is described as follows:

Step 100: Start;

Step 102: Apply band-pass filtering corresponding to the logical channel of a sample of the speech signal D1;

Step 104: Apply smooth filtering to the filtered sample of step 102;

Step 106: Apply a zero-crossing rate (ZCR) operation to the filtered sample of step 104 to determine whether or not a period of the speech signal D1 has been reached; if a period has been reached, go to step 108, if not, go to step 112;

Step 108: Detect the signal energy of samples of the period, compare the signal energy with a predetermined energy value, and compare the number of samples with a predetermined number of samples to determine whether or not the period is valid; if the signal energy meets the predetermined energy value and the number of samples is about equal to the predetermined number, period is valid, go to step 110; if one criterion is not met, go to step 112;

Step 110: Record the number of samples of the period;

Step 112: Check whether or not a frame period is complete; if one is, go to step 114, if not, go to step 102;

Step 114: Calculate the average value of the recorded number of samples of each period;

Step 116: Calculate the variance between the mean and the predetermined number of samples;

Step 118: Compare the variance with a threshold to determine whether or not the speech signal uses the logical channel and notify the control circuit; go back to step 102.

Figure 1:
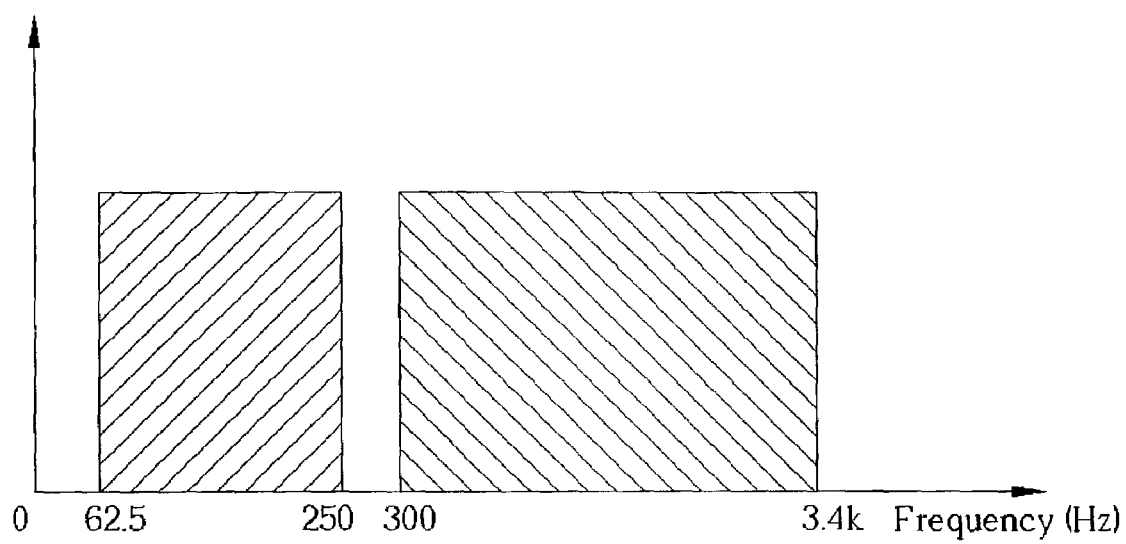
FIG. 1 is a graph of a frequency range used in a prior art CTCSS.

The operation of the DSP 34 for determining the tone signal is as follows. As illustrated in FIG. 1, the frequency range of a tone signal is from 62.5 Hz to 250 Hz and 38 tone signals of different frequency range are distributed between 62.5 hz and 250 Hz. Thus, the present embodiment uses 38 frequency ranges for filtering the speech signal D1 to simplify the following processing. For example, if a walkie-talkie is set with a logical channel $P_1$ ($T_{38}$), which is the $38^{th}$ tone signal having a frequency 250 Hz, for distinguishing a variety of speech signals transmitted on the physical channel $P_1$, the present embodiment applies a frequency range of 238 Hz to 250 Hz corresponding to the $38^{th}$ tone signal for filtering out speech signals from the frequency range of 238 Hz to 250 hz. Additionally, the DSP 34 applies band-pass filtering to the input speech signal D1 (step 102) to collect signals possibly associated with the $38^{th}$ tone signal. In the present embodiment, 38 frequency ranges are applied for filtering 38 corresponding tone signals, $T_1$ to $T_{38}$. In other words, a logical channel set up by the user with a corresponding frequency range is applied to filter signals out of the frequency range.

Due to possible noise interruption during signal communication between a person talking and a receiver, the waveform of a speech signal A1 received in a walkie-talkie may be affected and spikes may be generated. A smoothing filtering processing (step 104) is applied in the present embodiment to reduce the influences of noise on the speech signal A1.

Figure 5:
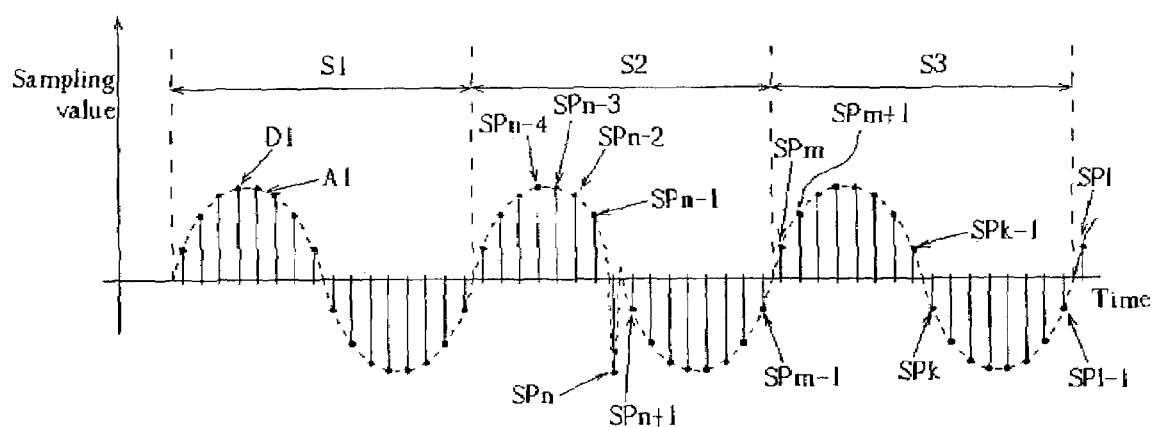
FIG. 5 is an oscillogram of the analog communication signal and the digital speech signal shown in FIG. 3.

Please refer to FIG. 5. FIG. 5 is an oscillogram of the analog communication signal A1 and the speech signal D1 shown in FIG. 3. The horizontal axis represents time, and the vertical axis represents sampling value. The speech signal A1, an analog signal, is sampled referencing a sampling frequency by the ADC 32 to generate the speech signal D1, a digital signal having a plurality of samples. As illustrated in FIG. 5, the speech signal D1 comprises three signal sectors S1, S2, and S3, and each signal sector corresponds to a period. In the signal sector S2 a spike exists between the samples $SP_{n-1}$ to $SP_{n+1}$, which changes the waveform so that the value of the sample $SP_n$ is altered from positive to negative. The present invention calculates the average value of the plurality of samples positioned before the sample to reduce the influences of noise. For example, for a sample $SP_n$, an average value of $SP_{n-4}$, $SP_{n-3}$, $SP_{n-2}$, $SP_{n-1}$, and $SP_n$ is calculated to update the sampling value of the sample $SP'_n$ so that the incorrect negative value is modified to a positive value to ease noise interruption. A prior art zero-crossing rate operation is applied in the present invention to determine the start and the end of a signal sector, where a positive-to-negative or negative-to-positive value transition represents one zero-crossing. A period from the first sample in a signal sector to the next zero-crossing point represents a half period of the signal sector, and two zero crossings after the first sample represent a complete period of the signal sector. As illustrated in FIG. 5, the sampling value of the sample $SP_{m-1}$ is negative and the sampling value of the next sample $SP_m$ is positive representing that the sample $SP_{m-1}$ is the last sample in the signal sector S2 and the sample $SP_m$ is the first sample of the signal sector S3. After the sample $SP_m$ in the signal sector S3, a zero-crossing occurs between the sample $SP_{k-1}$ and the sample $SP_k$, which represents a half period of the signal sector S3. Another zero-crossing occurs between the sample $SP_{l-1}$, the last sample of the signal sector S3, and the sample $SP_l$, the first sample of the next signal sector, representing the full period of the signal sector S3. Until sample $SP_{i-1}$, the last sample in the signal sector S3, a zero-crossing rate operation is applied to obtain corresponding samples in step 106. When the operation on samples in one signal sector is complete, the flowchart reaches step 112. In step 112, one operation time of the DSP 34 for detecting tone signals is checked for agreement with a frame period such as 150 ms. If the frame period has not yet been reached, step 102 is repeated for handling the next sample. Additionally, if one signal sector is determined to be complete in step 106, validity of the samples is further determined in step 108 and is described as follows.

According to the specification of a prior art CTCSS, the power ratio of signal energy of a tone signal, 62.5 Hz to 250 Hz, to a communication signal, 300 Hz to 3.4 KHz, is between 1:4 and 1:5. By calculating the signal energy of samples in a signal sector, noise between 62.5 Hz and 250 Hz not belonging to a tone signal is filtered out. For example, in step 102 signals having a frequency range of 238 Hz to 250 Hz can be filtered. However, noise in the same frequency range is unaffected by such band-pass filtering. By calculating the signal energy, the unfiltered noise can be filtered out due to its weak energy, which cannot satisfy the energy ratio limit of step 108. In step 108, if signal energy of samples in a signal sector is lower than a predetermined value, those samples will be ignored, and step 112 is subsequently performed for determining whether or not the frame period is over.

Additionally, the number of samples is checked in step 108 to filter out signal sectors hardly affected by noise. For example, the frequency of a tone signal T38 is 250 Hz and the sampling frequency of the ADC 32 is 16 KHz, and theoretically a signal sector must comprise 64 samples. However, a distortion may occur in a signal sector of the tone signal due to a noise interruption or a circuit interruption of the DSP 34 in operation, so that the period of the signal sector is altered temporarily such that the number of samples of the signal sector is greatly different from the ideal number 64. To avoid the interruption, a threshold is applied in the present embodiment wherein when the difference between the number of samples in a signal sector and the ideal number is larger than the threshold, step 108 is ignored and step 112 is immediately performed for determining whether or not the frame period is complete. Only if the energy ratio and the number of samples fit the predetermined requirements can the method apply step 110 to record the number of samples in the signal sector for further analyzing the tone signal.

When the frame period is complete, step 114 is performed. If the frame period is 150 ms, to the tone signal T38 having a frequency of 250 Hz, 37 signal sectors are generated and recorded in a frame period wherein the DSP 34 has to record 37 samples in a frame period. Please note that only the signal sectors having a complete period in a frame period are recorded; those having incomplete periods are ignored in the present embodiment. Through step 114, the present embodiment can calculate the average number of samples recorded in step 110. Due to movement of the person speaking and the receiver or interference of physical material, a frequency offset occurs during signal communication. Thus, the present embodiment applies an average value operation to reduce influences of frequency offset on sample number, making the operation of tone signal detection of the DSP 34 more concise. Next, step 116 is performed to calculate the variance of the average number and to compare the variance with the threshold for determining whether or not the logical channel is used. If the variance is less than the threshold, the logical channel used in the walkie-talkie is the same as that of the speech signals A1 and D1. Receiving such information, the control circuit 40 can start associated operations for outputting the speech signal of a person speaking from the walkie-talkie. Otherwise, if the variance is larger than the threshold, the logical channel used in the walkie-talkie is different than the speech signals A1 and D1. The DSP 34 cannot detect the tone signal applied in the walkie-talkie from the speech signals A1 and D1. Therefore, the control circuit 40 is notified to ignore the speech signal A1 such that the DSP 34 reapplies step 102 for detecting tone signals.

Please note that the smooth filtering disclosed in the present embodiment applied to reduce influences of abrupt transitions, such as spikes, on the subsequent zero-crossing rate operation can be replaced with another method. For example, another method could include taking a predetermined number of samples (such as seven) ahead of the sample under consideration, removing the two samples having the largest and smallest values, calculating the median among the remaining samples (or the mean of the six samples) to update the sampling value of the sample under consideration. The above-mentioned process can generate a more accurate result when used in step 106.

In addition, when the operation of the DSP 34 to determine voice signals in step 100 is complete, step 102 or alternatively step 112 can be applied according to the flowchart illustrated in FIG. 4 to fulfill demands of the present invention.

Additionally, step 106 disclosed in the present embodiment takes a complete period of the speech signal A1 as a signal sector. However, a half period of the voice signal A1 can also be used as a signal sector for applying the ZCR application to determine the start and end of each signal sector.

The present invention can not only be applied in a prior art CTCSS, but can also be used in other apparatuses for detecting signals of predetermined frequency, such as the North American weather alert signal using a frequency of 1050 Hz.

Compared to the prior art, the present invention converts an analog signal into a digital signal such that digital filtering processes can be applied to obtain an improved band-pass filtering effect. Smooth filtering processing is then applied to reduce affects of spikes on a zero-crossing rate operation. A predetermined signal energy ratio and a predetermined number of samples are further applied to reduce noise interruption. Finally, performing an average value operation on the number of samples in each signal sector reduces influences of frequency offset in radio communications. Therefore, applying the method of the present invention realizes a more accurate analytical result and reduces hardware costs.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for detecting a tone signal corresponding to a tone frequency with a radio communication device, the method comprising:

receiving an analog communication signal, and using a sampling frequency for converting the analog communication signal to a digital speech signal comprising a plurality of signal sectors, wherein each signal sector corresponds to a period;

selecting a plurality of first signal sectors corresponding to a predetermined frequency range from the digital speech signal in a frame time;

calculating an average value of the first number of samples of each first signal sector of the plurality of first signal sectors:

comparing the average value with a fourth number of samples of the tone signal divided by the sampling frequency for determining whether or not the analog communication signal comprises the tone signal; and according to a selected first number of samples in each first signal sector, determining whether or not the analog communication signal comprises the tone signal corresponding to the tone frequency, wherein the tone frequency is located in the predetermined frequency range.

2. The method of claim 1 further comprising successively selecting a second number of samples in each first signal sector, calculating the average value of the selected samples, and replacing the value of the first sample with the calculated average value.

3. The method of claim 2 wherein when successively selecting samples, the first sample is the last sample selected in a selecting time domain.

4. The method of claim 1 further comprising detecting a zero-crossing rate of each first signal sector for determining a period of the first signal sector, and calculating a third number of samples corresponding to each first signal sector in the frame time.

5. The method of claim 1 further comprising comparing a signal energy value of each first signal sector to a predetermined energy value for determining whether or not to select the first signal sector.

6. The method of claim 5 further comprising calculating a variance between the signal energy value and the predetermined energy value of each first signal sector, and if the variance is less than a first threshold, selecting the corresponding first signal sector.

7. The method of claim 1 further comprising comparing the first number of samples in each first signal sector to a predetermined number for determining whether or not to select the first sector.

8. The method of claim 7 further comprising calculating the variance between the first number of samples in each first signal sector and the predetermined number, and if the variance is less than a second threshold, selecting the corresponding first signal sector.

9. The method of claim 1 further comprising calculating a variance of the average value and the fourth number of samples of the tone signal divided by the sampling frequency, and if the variance is less than a third threshold, determining that the analog communication signal comprises the tone signal.

10. The method of claim 1 wherein the radio communication device is a portable walkie-talkie.

11. The method of claim 1 applied to a continuous tone-coded squelch system, wherein the radio communication device determines whether or not a signal being transmitted on a channel by the tone signal corresponds to the tone frequency.

12. A method for detecting a tone signal corresponding to a tone frequency with a radio communication device, the method comprising:

(a) applying a band-pass filter corresponding to a logical channel of a sample of a digital speech signal;

(b) applying smooth filtering to the filtered sample;

(c) applying a zero-crossing operation to the smooth filtered sample to determine when a predetermined integer multiple of one-half of a period of the smooth filtered sample has been reached, the predetermined integer multiple of one-half of a period of the smooth filtered sample equaling a sampling sector;

(d) comparing signal energy of samples of the sampling sector with a predetermined energy value;

(e) comparing quantity of samples of the sampling sector with a predetermined quantity;

(f) determining the sample sector to be valid only if the signal energy meets the predetermined energy value and the quantity of samples is within a predefined threshold of the predetermined quantity;

(g) recording the quantity of samples if the sample sector is valid;

(h) repeating steps (a) through (g) until a predetermined quantity of recordings of the quantity of samples in the valid sample sectors have been obtained;

(i) calculating an average value of the recorded quantities of samples the valid signal sectors;

(j) calculating variance between the average value and the predetermined quantity; and (k) determining that the digital speech signal uses the logical channel only if the variance is within a predetermined threshold.

13. The method of claim 12 wherein the predetermined integer multiple of one-half of a period of the smooth filtered sample is 2.

14. The method of claim 12 wherein the smooth filtering to the filtered sample comprises calculating an average value of samples positioned before a current sample to modify a value of the current sample.

15. The method of claim 13 wherein the smooth filtering to the filtered sample comprises taking a first predetermined number of samples positioned before a current sample, removing the taken samples having the highest and the lowest values, calculating a mean of the remaining taken samples to modify a value of the current sample.

* * * * *